(12) United States Patent
Kuegerl et al.

(10) Patent No.: US 9,728,706 B2
(45) Date of Patent: Aug. 8, 2017

(54) METHOD FOR PRODUCING A MULTILAYER ELEMENT

(75) Inventors: Georg Kuegerl, Eibiswald (AT); Wolfgang Bauer, Wies (AT); Manfred Reinisch, Gr. St. Florain (AT); Franz Aldrian, Hollenegg (AT); Marion Ottlinger, Deutschlandsberg (AT)

(73) Assignee: EPCOS AG, Munich (DE)

( * ) Notice: Subject to any disclaimer, the term of this patent is extended or adjusted under 35 U.S.C. 154(b) by 686 days.

(21) Appl. No.: 13/194,830

(22) Filed: Jul. 29, 2011

(65) Prior Publication Data

US 2011/0277913 A1 Nov. 17, 2011

Related U.S. Application Data

(60) Division of application No. 12/534,610, filed on Aug. 3, 2009, now abandoned, which is a continuation of
(Continued)

(30) Foreign Application Priority Data

Feb. 2, 2007 (DE) .......................... 10 2007 005 341

(51) Int. Cl.
*H05K 3/46* (2006.01)
*H01L 41/083* (2006.01)
(Continued)

(52) U.S. Cl.
CPC .......... *H01L 41/0838* (2013.01); *B32B 18/00* (2013.01); *H01L 21/481* (2013.01);
(Continued)

(58) Field of Classification Search
CPC . H01L 41/273; H01L 41/277; H01L 41/0833; H01L 41/0838; H01L 21/481;
(Continued)

(56) References Cited

U.S. PATENT DOCUMENTS 4,680,154 A * 7/1987 Matsubara et al. ....... 264/670 X
4,932,119 A * 6/1990 Ealey et al. .......... H01L 41/083
(Continued)

FOREIGN PATENT DOCUMENTS

DE 102 17 097 A1 11/2002
DE 102 34 787 C1 10/2003
(Continued)

OTHER PUBLICATIONS

Kaminaga, K., "Automated Isostatic Lamination of Green Sheets in Multilayer Electric Components", Electronics Manufacturing Technology Symposium, 1997, pp. 252-255.*

*Primary Examiner* — A. Dexter Tugbang
(74) *Attorney, Agent, or Firm* — Slater Matsil, LLP (57) ABSTRACT

A method for producing a ceramic multilayer element is disclosed. In an embodiment the method includes forming a plurality of multilayer segments in a green state, wherein each multilayer segment is formed by pressing together a plurality of ceramic layers in the green state and pressing together the multilayer segments in the green state to form a multilayer element that is in the green state. The method further includes sintering the multilayer element that is in the green state to form a ceramic multilayer element that includes the ceramic layers and electrode layers arranged one on top of another, wherein at least one or more of a temperature at which the multilayer segments are pressed together, a pressing force applied during the pressing of the multilayer segments, and/or a duration of the pressing of the multilayer segments are adjusted.

33 Claims, 3 Drawing Sheets

Related U.S. Application Data application No. PCT/EP2008/051220, filed on Jan. 31, 2008.

(51) Int. Cl.
*H01L 21/48* (2006.01)
*H01L 41/277* (2013.01)
*H01L 41/273* (2013.01)
*B32B 18/00* (2006.01)
*C04B 35/634* (2006.01)

(52) U.S. Cl.
CPC ........ *H01L 41/083* (2013.01); *H01L 41/0833* (2013.01); *H01L 41/273* (2013.01); *H01L 41/277* (2013.01); *H05K 3/4629* (2013.01); *H05K 3/4638* (2013.01); *C04B 35/634* (2013.01); *C04B 2235/604* (2013.01); *C04B 2237/348* (2013.01); *C04B 2237/68* (2013.01); *C04B 2237/704* (2013.01); *H01L 2924/09701* (2013.01); *Y10T 29/42* (2015.01); *Y10T 29/435* (2015.01); *Y10T 29/49126* (2015.01); *Y10T 29/49163* (2015.01)

(58) Field of Classification Search
CPC ......... H01L 2824/09701; H01L 41/083; H01L 2924/09701; C04B 2237/68; C04B 2237/704; C04B 35/634; C04B 2235/604; C04B 2237/348; H05K 3/4629; H05K 3/4638; Y10T 29/42; Y10T 29/435; Y10T 29/49126; Y10T 29/49163; B32B 18/00
USPC ... 29/25.35, 25.41, 25.42, 830, 831, 407.08; 264/618, 669, 670; 257/701, 702
See application file for complete search history.

(56) References Cited

U.S. PATENT DOCUMENTS

| | | | |
|---|---|---|---|
| 5,316,602 A * | 5/1994 | Kogame | H05K 3/4629 156/251 |
| 6,260,248 B1 | 7/2001 | Cramer et al. | |
| 6,597,058 B1 * | 7/2003 | Natarajan et al. | 257/702 X |
| 7,358,655 B2 | 4/2008 | Ragossnig et al. | |
| 7,420,319 B2 | 9/2008 | Kastl et al. | |
| 7,449,077 B2 | 11/2008 | Heinzmann et al. | |
| 7,468,112 B2 | 12/2008 | Sato et al. | |
| 2002/0152857 A1 | 10/2002 | Sato et al. | |
| 2003/0107867 A1 | 6/2003 | Iwase et al. | |
| 2003/0168784 A1 | 9/2003 | Iwase et al. | |
| 2004/0139599 A1 | 7/2004 | Sumiya et al. | |
| 2006/0238073 A1 | 10/2006 | Ragossnig et al. | |
| 2008/0203853 A1 | 8/2008 | Schuh et al. | |
| 2009/0015109 A1 | 1/2009 | Schuh | |
| 2009/0278422 A1 | 11/2009 | Florian et al. | |

FOREIGN PATENT DOCUMENTS

| | | |
|---|---|---|
| DE | 10 2004 007 999 A1 | 9/2004 |
| DE | 103 07 825 A1 | 9/2004 |
| DE | 10 2004 031 402 A1 | 2/2006 |
| DE | 10 2004 050 803 A1 | 4/2006 |
| DE | 10 2005 015 112 A1 | 10/2006 |
| DE | 10 2005 050 340 A1 | 2/2007 |
| EP | 0 247 540 A2 | 12/1987 |
| EP | 1 764 844 A1 | 3/2007 |
| JP | 6-165540 A | 6/1994 |
| JP | 08-306979 A | 11/1996 |
| JP | 2003-174210 A | 6/2003 |
| JP | 2003-258332 A | 9/2003 |
| JP | 2005-142222 A | 6/2005 |
| JP | 2007-019420 A | 1/2007 |
| JP | 2008-546206 | 12/2008 |
| WO | WO 2004/077583 A1 | 9/2004 |
| WO | WO 2006/131106 A2 | 12/2006 |
| WO | WO 2007/012484 A1 | 2/2007 |

* cited by examiner

METHOD FOR PRODUCING A MULTILAYER ELEMENT

This application is a divisional of U.S. patent application Ser. No. 12/534,610, filed Aug. 3, 2009, which is a continuation of co-pending International Application No. PCT/EP2008/051220, filed Jan. 31, 2008, which designated the United States and was not published in English, and which claims priority to German Application No. 10 2007 005 341.1 filed Feb. 2, 2007. All of these applications are incorporated herein by reference.

TECHNICAL FIELD

A method for producing a multilayer element is described, for example, a method in which the multilayer segments are pressed together. Also described is a multilayer element with predetermined breakage regions.

BACKGROUND

A method for making a multilayer actuator is known from the German publication DE 102 34 787 C1. Microdistortions are intentionally made in the actuator framework, which grow inwardly upon polarization of the actuator.

An electrical multilayer element with ceramic layers arranged along a lengthwise axis, where at least one predetermined breakage layer is arranged at a point on the lengthwise axis between ceramic layers is known from International publication WO 2004/077583. It is less stable to tensile stresses in the lengthwise direction than are the ceramic layers.

SUMMARY

In various aspects, the present invention provides an electrical multilayer element that remains functional under repeated mechanical stresses and a method for producing such a multilayer element.

For example, the invention specifies a method for producing a ceramic multilayer element in which a number of ceramic multilayer segments are pressed together. The ceramic multilayer segments each have a plurality of ceramic layers pressed together.

A multilayer segment is understood to mean a stack of at least two ceramic layers with any outer contour. A multilayer element results from a stack of multilayer segments arranged one on top of another and pressed together.

Thin multilayer segments are made available, the external shaping of which can take place, for example, by means of a cutting tool, without damaging the multilayer segments, and optionally using a less energetically or less powerfully driven cutting tool can be enabled by the choice of a certain small number of pressed ceramic layers. Since a plurality of the multilayer segments formed in this way are pressed together, a complete multilayer element, for example, a piezoelectric multilayer element, can be created with the desired outer contour and thickness. Here the outer contour is at least in part rounded, circular or oval.

Thus, there is a decisive advantage over multilayer elements that are first cut to size only after they have reached their ultimate thickness and are subject to damage, since the cutting means used for this must be driven with great force through a great deal of material in one pass.

Compared to multilayer elements in which individual, already cut to size, ceramic layers are stacked one on top of another, there is the advantage of eliminating the stacking of each separate, already cut ceramic layer with another ceramic layer.

Also, handling of multilayer segments, for example, during transport, is easier than with individual ceramic layers. The probability of process errors, which can accumulate with each separation of a ceramic layer, can be minimized.

The production time for a multilayer element is advantageously significantly reduced, since each individual ceramic layer does not have to be placed on another ceramic layer.

The production process offers the advantage that multilayer elements can be created in any height. This makes it possible to design elements that satisfy certain criteria that apply in the case of tight placement conditions when inserted into a device that uses the multilayer element.

Another advantage is that multilayer elements can already be created in an unsintered, i.e., green, state with a desired outer contour. This eliminates the need, for example, to give a sintered element the desired external geometry by means of a cost- and time-intensive grinding operation. Where this step is omitted, it is possible, for example, to apply external contacts flush or directly onto the sintered element. Thus, this produces an additional beneficial effect.

Preferably, a plurality of ceramic films are pressed together into a film stack as a precursor product, where the ceramic films preferably contain an organic binder, so that the pressing, or handling, of the films, for example, in transport, is made easier.

The ceramic film stack or the stacked ceramic films have a large surface in relationship to the cross-sectional area of a ceramic multilayer segment that is to be separated out later, i.e., the ceramic film stack, as a precursor product, preferably comprises a multiple of the area of the multilayer segments to be separated out later, which are called the afterproduct.

It turns out to be particularly favorable if the temperature at which the ceramic films are pressed together is lower than the temperature at which the multilayer segments are pressed together. This will achieve bonding of the multilayer segments to each other such that, at least in the ultimately sintered element, the boundary region between the multilayer segments has lower resistance to tensile stresses. In comparison, the ceramic layers of an individual multilayer segment are firmly bonded together.

According to a preferred embodiment of the production process, the binding effect of the organic binder while pressing the multilayer segments is set to be different than the binding effect during the pressing of the ceramic films. Preferably, here a binder is selected whose activity is dependent on a number of process parameters, for example, temperature, force with which the multilayer segments are pressed together, duration of the pressing force, and the atmosphere or composition of the atmosphere in which the films and/or the multilayer segments are pressed together. Controlled change of the activity of the binder has the advantage that the binding or adhesion of the multilayer segments to each other can be controlled.

According to one embodiment, the ceramic layers contained in the multilayer segments are in the green state during the pressing operation. This means that the multilayer segments do not first have to be separately sintered.

The temperature at which the ceramic films are pressed together preferably varies from room temperature by a maximum of 25%. The temperature at which the multilayer segments are pressed together preferably lies between 75° C. and 95° C.

It is preferred that the tensile strengths of the boundary region between the multilayer segments be determined by adjusting the temperature at which the multilayer segments are pressed together.

The tensile strength of the boundary region between the multilayer segments can also be determined by adjusting the pressure applied in pressing the multilayer segments.

In addition or alternatively, the tensile strength of the boundary region between the multilayer segments can be determined by adjusting the duration of the pressing of the multilayer segments.

By adjusting the process parameters of temperature, pressure and/or duration of pressing, a tensile strength is determined for the boundary region between two multilayer segments that gives these segments the function of a predetermined breakage region. Thus, in each case according to the use of the multilayer element, it is possible to design a predetermined breakage region that responds or forms a crack at certain mechanical stresses. The predetermined breakage region thus forms a tailored mechanical weak point in the multilayer element.

A predetermined breakage region that arises between two multilayer segments of a multilayer element by means of a production process described in this document allows, under certain tensile stresses, a controlled cracking into the interior of the multilayer element. The cracking thus runs essentially parallel to the plane of the ceramic layers.

The multilayer segments are preferably cut from the precursor foil stack by means of a cutting tool. They can be cut out with any desired outer contour. Thus, multilayer segments are cut with, in particular, circular or oval contours or at least nearly circular or oval contours, so that multilayer elements with such contours can be created for high quality or stability demands.

From the standpoint of process engineering, it turns out to be particularly advantageous if the cutting tool directly transports the separated multilayer segments further on, for example, to another manufacturing unit for further processing.

According to one embodiment, the multilayer segments are transported into a cavity for pressing. By means of such a method, the need for a conveyor means that is used only for transport, for example, a conveyor belt or gripper, is omitted.

If a stamping tool is used as the cutting tool, the multilayer segments can be cut from the foil stack with particular speed. Since the foil stack is, relatively speaking, not very thick, the stamping tool can stamp out the likewise relatively thin multilayer segments with any cross-sectional shape without damaging them.

Preferably, in each case, two adjacent multilayer segments are pressed together in a repeated operation. For a multilayer element that has, for example, 50 multilayer segments, then 49 pressing operations are carried out, one for each pair of adjacent multilayer segments. The number of pressing operations is thus one less than the number of multilayer segments in the end multilayer element.

According to one embodiment of the method, the multilayer segments are pressed together by pressing a stamping tool onto a face surface of a multilayer segment which has been inserted into the cavity. The multilayer segment on which the stamping tool presses is always in the uppermost position in the cavity.

According to another embodiment of the manufacturing process, the multilayer segments are pressed together with the additional use of a press pin, which presses against the undermost multilayer segment in the cavity, toward the stamping tool.

Ceramic films with imprinted metallizations can be used to produce the multilayer segments. These metallizations can later serve as electrodes or electrode layers of the ultimately produced multilayer element.

Warpage during pressing which might lead to bending of internal electrodes that may be present, at least at the ends of the multilayer element, is highly minimized by means of the production process, since individual multilayer segments are pressed together rather than an entire multilayer element of greater thickness. This minimizes convex or concave bending of the internal electrodes (with respect to the axis running through the multilayer element in the vertical direction). All in all, a multilayer element with high symmetry is created.

A piezoelectric multilayer element can be created by means of the production process. For this, the ceramic layers preferably contain a PZT (lead zirconate titanate) ceramic. These ceramic films can contain a binder, which is burned out during a debinding before the multilayer element is subjected to a sintering operation.

In addition, a multilayer element with a stack of ceramic layers and electrode layers arranged on top of one another is specified, where a predetermined breakage region with reduced tensile strength running parallel to the ceramic layers is localized between adjacent ceramic layers and partially merges into them. Adjacent ceramic layers thus have a portion of the predetermined breakage region.

The multilayer element has a plurality of multilayer segments that are pressed together and that have individual ceramic layers, and these segments are sintered together. With that, the predetermined breakage region runs between adjacent ceramic layers and partially penetrates into them or is partially contained in the ceramic layers. Adjacent ceramic layers belonging to different multilayer segments form parts of the predetermined breakage region.

The multilayer element or the multilayer segments which it comprises are preferably a product of the production process described in this document in all of its possible embodiments.

The predetermined breakage region according to one embodiment has a porosity that is higher than the average porosity of the ceramic layers in the overall multilayer element.

Edge- or face-side ceramic layers of adjacent multilayer segments can have regions that abut one another or merge into one another and that have less tensile strength or are more porous than the ceramic layers that are turned away from the boundary between the multilayer segments. The elevated porosity can also be understood as lower packing density of the ceramic grains in the corresponding region.

The predetermined breakage region between the multilayer segments forms a crack running into the interior of the multilayer element when the multilayer element is subjected to certain mechanical stresses. If an electrode layer or a flat metallization is arranged between the multilayer segments, the crack will run along or parallel to the electrode or through the electrode layer, and thus does not connect two electrodes that are arranged one above the other. An electric short circuit that would lead to failure of the multilayer element can thus be avoided.

The multilayer element preferably has a plurality of predetermined breakage regions distributed over the thickness of the multilayer element at regular intervals. The intervals, i.e., the space between two adjacent predetermined breakage regions, comprise a plurality of ceramic layers and electrode layers, between which no predetermined breakage region is made available.

BRIEF DESCRIPTION OF THE DRAWINGS

The described embodiments are described in more detail by means of the following embodiment examples. Here:

FIG. 1, which includes FIGS. 1a and 1b, shows a multilayer element with a predetermined breakage site in a first arrangement;

FIG. 2, which includes FIGS. 2a and 2b, shows a multilayer element with a predetermined breakage site in a second arrangement;

The following list of reference symbols may be used in conjunction with the drawings:

1 Multilayer element
2 Ceramic layer
3 Electrode layer
4 Multilayer segment
5 Predetermined breakage site
6 External contact
7 Massive block
8 Cavity
9 Punch tool
10 Bottom-side opening of cavity
11 Vertical fastener drilling
12 Horizontal drilling
13 Upper side opening of cavity
A-A Section line

DETAILED DESCRIPTION OF ILLUSTRATIVE EMBODIMENTS

FIG. 1a shows a multilayer element 1 with ceramic layers 2 and electrode layers 3 arranged alternately one above the other. FIG. 1b shows a magnified section from FIG. 1a. The multilayer element has a plurality of multilayer segments 4, each of which has a plurality of ceramic layers and electrode layers. Between each two adjacent multilayer segments 4 is a predetermined breakage region 5, which is designed as a region with reduced strength compared to the surface areas between other ceramic layers deeper into the interior of each multilayer segment 4. The predetermined breakage region 5 is contained in the boundary region between two adjacent multilayer segments and merges with its reduced mechanical strength into an undermost and uppermost ceramic layer of adjacent multilayer segments.

The predetermined breakage region 5 is realized, by means of the method of producing the multilayer element, as a region of reduced porosity by comparison with the porosity of other ceramic layers within each multilayer segment 4. The elevated porosity in the boundary region between two multilayer segments 4 can be determined by adjusting the combination of the following parameters:

Temperature and/or applied pressure and duration of pressing force at which the ceramic films are pressed together to form the precursor product film stack, Choice of a binder used for the ceramic films, its binding effect in dependence on the parameters mentioned above, Temperature and/or pressure and duration of pressure at which the multilayer segments are pressed together.

Figure 1:
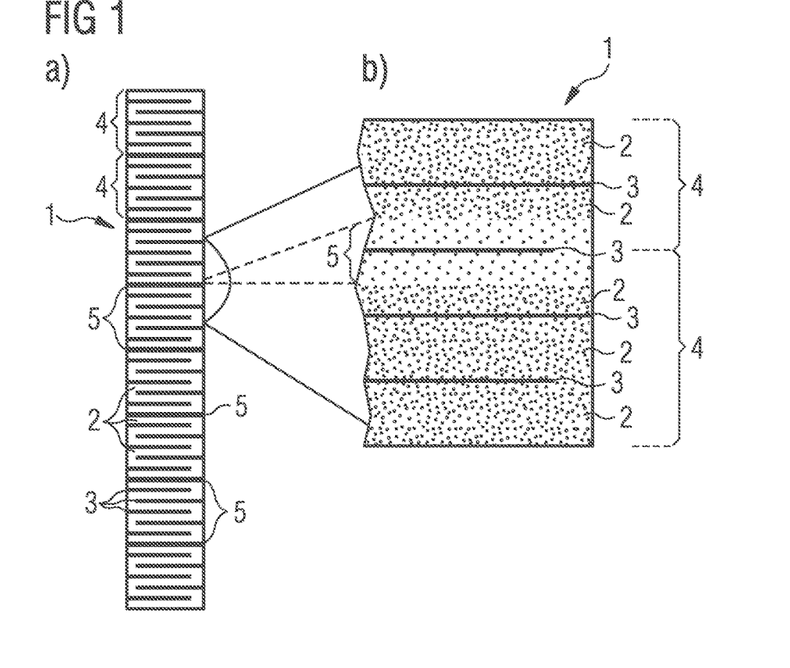

FIG. 1 shows in particular how the boundary region between two multilayer segments 4 can be designed. The boundary region with reduced tensile strength runs, according to one embodiment, between two edge- or face-side ceramic layers 2 of adjacent multilayer segments 4, where one of the ceramic layers is provided with an imprinted internal electrode layer 3. This means that the predetermined breakage site 5 runs through the internal electrode layer 2, or cracking caused by certain tensile stresses runs through the internal electrode layer.

Figure 2:
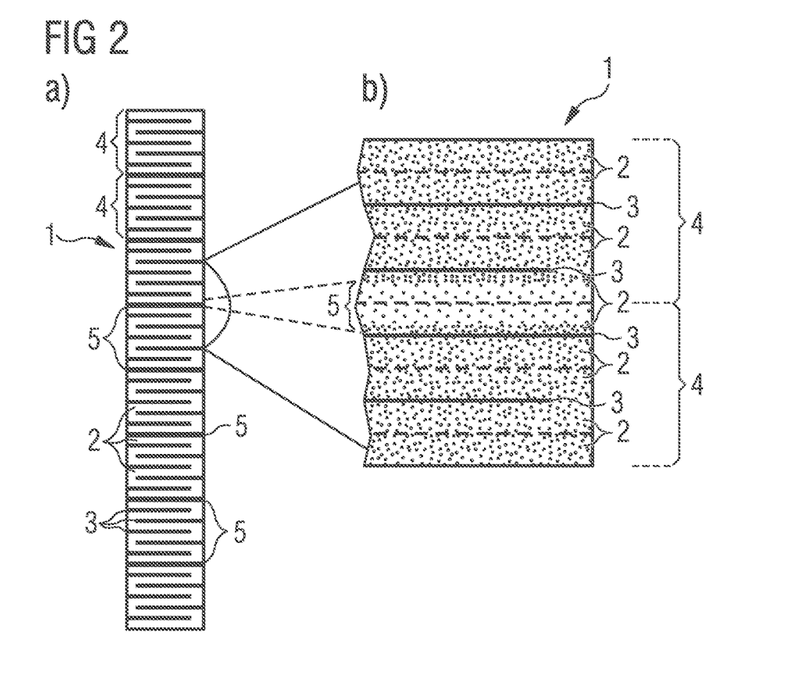

FIG. 2a shows a multilayer element 1 with ceramic layers 2 and electrode layers 3 arranged alternately one above the other. FIG. 2b shows an enlarged section from FIG. 1a. In composition, this embodiment of the multilayer element corresponds to that of FIG. 1. The predetermined breakage region 5 on two adjacent multilayer segments, however, is designed differently here. It merges into two edge- or face-side and adjacent ceramic layers 2 of adjacent multilayer segments 4, and there is no electrode layer 3 between these ceramic layers 2. A construction of this kind can be achieved, for example, by stacking the multilayer segments stamped out of a film stack with different orientations for pressing. This means that, for example, two multilayer segments 4 that are adjacent and pressed together can have face surfaces turned toward each other, with these face surfaces free of internal electrode layers 3.

Figure 3:
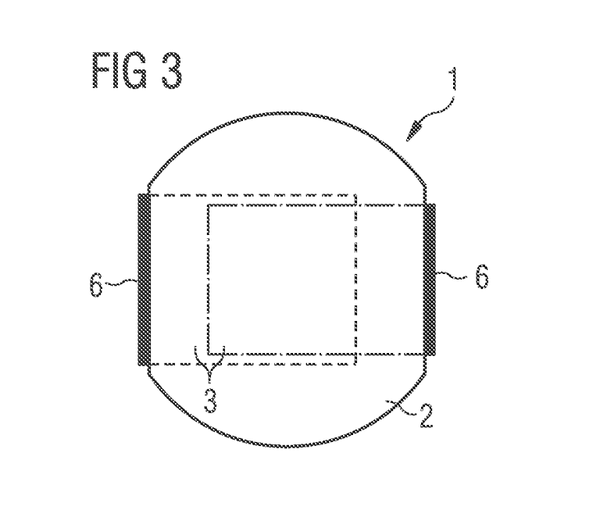
FIG. 3 shows a cross-sectional view of a multilayer element.

FIG. 3 shows a multilayer element 1 with a preferred contour in a top view. The multilayer element or each multilayer segment 4 of the multilayer element in this case is circular in cross section, with flat sides. In a particularly favorable way, external electrodes 6 can be applied to or arranged on the flattened side, where the electrodes are each in contact with a set of internal electrode layers 3 arranged one above the other and having the same electric polarity.

The multilayer element or its multilayer segments preferably have a diameter of 8-10 mm; the flattened sides each have a length of 2-4 mm.

Preferably, the following operation is chosen to produce the multilayer element.

According to one embodiment, in producing a multilayer element, after the addition of a suitable binder and disperser system in the form of a slurry, a ceramic powder with piezoelectric properties is processed into films.

The films are imprinted according to the desired design with an electrode paste, in particular, screen-printed, so that an isolation zone on the flattened segments of the multilayer element is made available. The isolation zone comprises a nearly field-free region, where adjacent internal electrodes do not overlap. Each film is again imprinted, where the printing of adjacent films of a film stack takes place with an offset.

This is followed by the lamination or stacking of, preferably, 25-50 films. They are pressed together to a thickness of 1-2 mm by means of a pressing operation at about room temperature under a weight of 100 metric tons, with respect to an area of 105×105 mm$^2$. The dielectric thickness of each ceramic film is then about 100-120 µm. The low thickness of the film stack enables multilayer segments of any kind to be cut from the film stack, preferably ones with a round, oval or octagonal cross section.

Multilayer segments with the desired cross-sectional shape are stamped out of the pressed film stack with a stamp.

The stamp or stamping tool comprises a sharp projecting edge for stamping out multilayer sequences; further inward, it has a flat area that presses on the multilayer segment surface and separates it from the film stack.

Advantageously, the stamped-out multilayer segments, in contrast to individual ceramic layers (which each come from a single ceramic film) are much easier to handle in the process of manufacturing the multilayer element. For example, they can be grabbed and transported better. In this case, the risk of damage to these multilayer segments is also reduced. The effectiveness of these advantages is especially apparent when the cross-sectional area of the stamped out multilayer segment is 20 mm$^2$ or smaller.

The multilayer segments with low height that are stamped from the film stack or stacks are preferably stacked in a cavity by means of the stamping tool. A multilayer segment is pressed onto a multilayer segment or partial multilayer element that is already in the cavity, at a force of 1500 N at about 85° C. The operation is repeated until a piezoelectric multilayer element with any desired height, preferably between 70 and 100 mm, is made.

The advantage of pressing small volumes becomes clear in this case, since the scatter of the applied pressure is relatively small with respect to a small area. Frictional forces on the inner walls of the cavity that arise are smaller than in the case of larger multilayer elements, for example, ones that have a height of 10-1000 mm. Thus, multilayer elements with extremely high symmetry can be made; pressing warpages can no longer be detected in a completed multilayer element. Moreover, the production process provides that internal electrodes that may be present in a multilayer element are not affected or are only minimally affected by warpage or bending. In the absence of the pressing warpage noted above, internal electrode parts that are creased or bent over at the edge of the multilayer element are no longer seen.

Preferably used criteria for establishing the absolute breaking force at the seam between the multilayer segments are the applied pressure, temperature or hold time in a pressing operation.

A still-green multilayer element produced by pressing multilayer segments can then be debinded and sintered. External contacts can then be applied to the side surfaces of the multilayer element.

Measurement of multilayer elements made by pressing multilayer segments show a seam region between two adjacent multilayer segments with lower strength than the bonds between individual ceramic layers lying in the multilayer segments. An advantage of this effect was seen to be that the multilayer element, because of the weaker seam regions, contains one or more predetermined breakage sites that favor a stable failure or controlled failure of the multilayer element. Additional process or manufacturing steps to introduce predetermined breakage sites into the element can thus be omitted. From the standpoint of manufacturing technology, the number of predetermined breakage sites alone is already determined by the height of the multilayer element, since a certain height of the multilayer element implies a number of multilayer segment boundaries and thus predetermined breakage regions.

The predetermined breakage region responds at certain tensile stresses, where it forms a crack running parallel to the ceramic layers or electrode layers. Since the dielectric cannot be entirely broken through in the direction between two internal electrodes by the crack, a short circuit between two electric poles of the multilayer element supported by internal electrodes situated one above the other caused by certain tensile stresses can be avoided.

Figure 4:
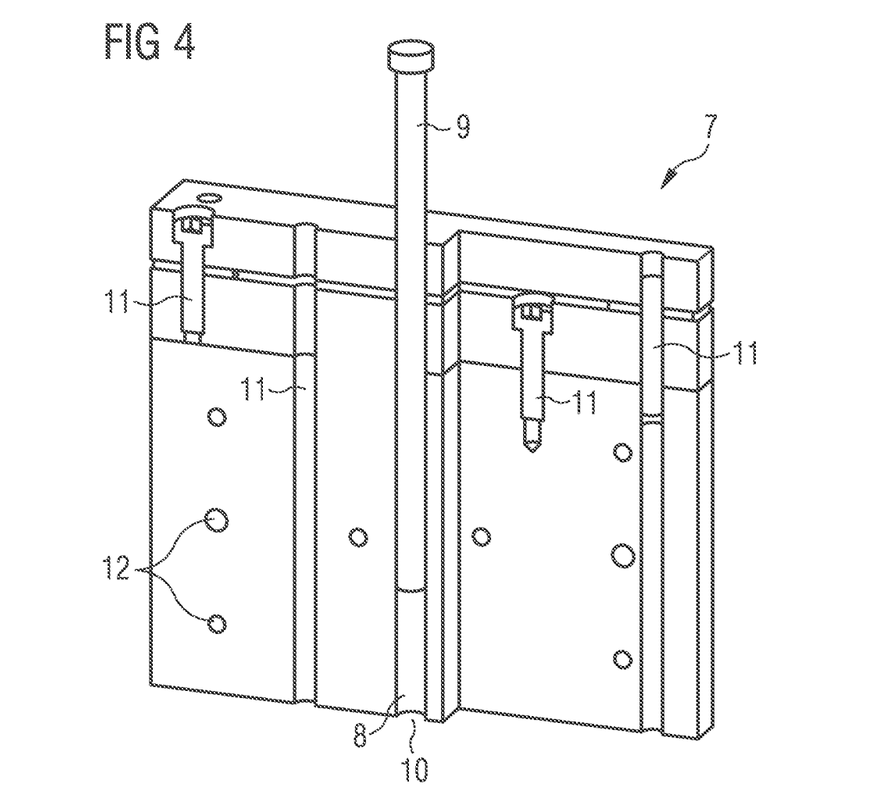
FIG. 4 shows a perspective view of a part of an essentially massive block comprising a cavity, with a partially inserted punching tool.
Figure 5:
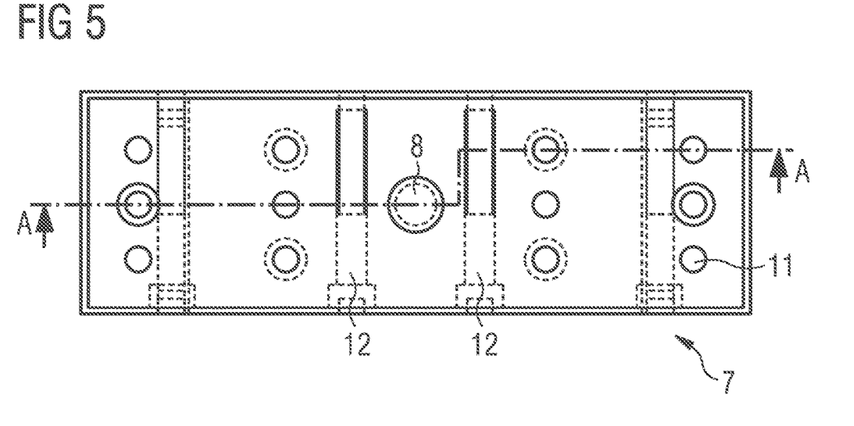
FIG. 5 shows a top view of an essentially massive block comprising a cavity.
Figure 6:
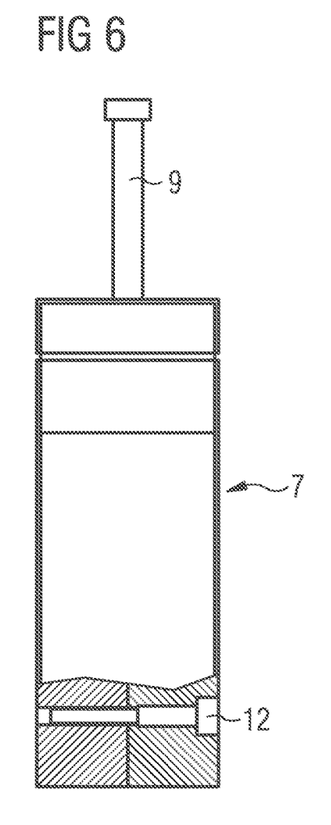
FIG. 6 shows a side view of an essentially massive block comprising a cavity, with a partially inserted punching tool.

FIGS. 4-6 show different perspective views of a preferably massive metallic block 7, in which multilayer segments are pressed together to form a multilayer element 1 in a cavity 8 by means of a stamping tool 9.

For illustration, FIG. 4 shows a section of a preferably massive and metallic block 7 in a perspective view.

The block has the following dimensions: width=130-170 mm, height=115-155 mm, depth=30-70 mm. A cavity 8, which is realized as a drilling, runs centrally and vertically through block 7. The cavity 8 has an opening 10 at the bottom that allows the insertion of a press pin, not shown, which pushes against a stamping tool 9, which is shown inserted into the cavity. The cavity 8 has an internal clear diameter that is dimensioned so that a multilayer segment can be inserted into the cavity 8 together with the transport means or stamping tool 9 that surrounds and transports the multilayer segment.

Multilayer segments arranged between the press pin, which pushes from below, and the stamping tool 9, inserted from above, are pressed together.

According to one embodiment, the press block 7 has a number of parts that are positioned on locating pin(s) and secured with screws. However, the press block can also be made in one piece, i.e., from a casting.

Preferably, the press block is made of steel, and other materials such as ceramic, sintered materials or other hard metals can be used.

The press block 7 has a plurality of vertically running drillings 11, which according to one embodiment serve to secure the block 7 by means of screws or other fastening means to another object, for example, another housing. Horizontal fastener drillings 12 are also shown. By means of suitable fasteners such as screws, the horizontal fastener drillings 12 serve for assembly of the possibly several parts of the block 7 (of which only one part is shown by this figure) into a block unit.

According to an advantageous embodiment, heating elements are inserted into the vertically running drillings 11 to heat the press block. The heating elements can be realized as heating resistance wires. The heating elements can be contained in drillings 11 together with a fastening element if the drillings 11 are also used to fasten the press block.

FIG. 5 shows a top view of block 7 that is shown only partially in perspective view in FIG. 4. An opening of cavity 8 is shown on the top side and centrally arranged in the block. The section line A-A is also shown; a section of the entire block through this section line was shown in the previous figure. The lateral course of the horizontal fastener drillings 12 and the openings of the vertical drillings 11 are shown.

FIG. 6 is a side view of block 7. The partially inserted stamping tool 9 is shown at the top. The lateral course of a fastener drilling 12 is shown at the bottom.

What is claimed is:

1. A method for producing a ceramic multilayer element, the method comprising:
   forming a plurality of multilayer segments in a green state, wherein each multilayer segment has a plurality of ceramic layers in the green state and a plurality of electrode layers, wherein, while forming the plurality of multilayer segments, the multilayer segments are not located one on top of the other but are separate from each other, wherein each multilayer segment is formed separately by pressing together the plurality of ceramic layers and electrode layers at one pressing force;

stacking the plurality of multilayer segments in the green state one on top of the other after forming the plurality of multilayer segments;

pressing together the stacked multilayer segments in the green state thereby forming a multilayer element that is in the green state, wherein the one pressing force is greater than a pressing force applied during the pressing together of the stacked multilayer segments; and sintering the multilayer element that is in the green state thereby forming the ceramic multilayer element, the ceramic multilayer element comprising the ceramic layers and electrode layers arranged one on top of another, wherein at least one or more of a temperature at which the stacked multilayer segments are pressed together, the pressing force applied during the pressing together of the stacked multilayer segments, and a duration of the pressing together of the stacked multilayer segments, are adjusted such that the sintered ceramic multilayer element includes a boundary region between the stacked multilayer segments, the boundary region having a tensile strength that causes the boundary region to function as a predetermined breakage region, wherein the tensile strength is determined by adjusting at least the pressing force applied during the pressing together of the stacked multilayer segments.

2. The method as claimed in claim 1, wherein forming the multilayer segments comprises pressing together the plurality of ceramic layers into a film stack, each ceramic layer containing an organic binder.

3. The method as claimed in claim 2, wherein pressing together the plurality of ceramic layers comprises pressing the ceramic layer together at a temperature that is lower than a temperature at which the multilayer segments are pressed together.

4. The method as claimed in claim 3, wherein the temperature at which the ceramic layers are pressed together deviates by a maximum of 25% from room temperature, and the temperature at which the multilayer segments are pressed together is between 75° C. and 95° C.

5. The method as claimed in claim 2, wherein a binding effect of the organic binder during the pressing together of the multilayer segments differs from a binding effect during the pressing of the ceramic layers.

6. The method as claimed in claim 2, wherein forming the multilayer segments further comprises separating the multilayer segments from the film stack using a cutting tool.

7. The method as claimed in claim 6, wherein the multilayer segments are separated from the film stack with a contour shape.

8. The method as claimed in claim 7, wherein the multilayer segments have one of the following contour shapes: rounded, circular with flattened sides, circular, or oval.

9. The method as claimed in claim 6, wherein the cutting tool transports the separated multilayer segments.

10. The method as claimed in claim 9, wherein the cutting tool transports the separated multilayer segments into a cavity for pressing.

11. The method as claimed in claim 10, wherein the cutting tool comprises a stamping tool and wherein the multilayer segments are pressed together by the stamping tool pressing on a face surface of the multilayer segment that was last inserted into the cavity.

12. The method as claimed in claim 11, wherein the multilayer segments are pressed together applying a press pin that presses on an undermost multilayer segment that is in the cavity, toward the stamping tool.

13. The method as claimed in claim 6, wherein the cutting tool comprises a stamping tool.

14. The method as claimed in claim 2, wherein the ceramic layers comprise ceramic layers with imprinted metallizations.

15. The method as claimed in claim 1, wherein the ceramic multilayer element includes the boundary region between the stacked multilayer segments in an end multilayer element that provides the ceramic multilayer element with a function.

16. The method as claimed in claim 15, further comprising separating the stacked multilayer segments from a film stack using a cutting tool.

17. The method as claimed in claim 16, wherein the ceramic layers comprise ceramic layers with imprinted metallizations and wherein the multilayer element forms at least a part of a piezoelectric multilayer element.

18. The method as claimed in claim 1, wherein the tensile strength being determined by adjusting the duration of the pressing together of the stacked multilayer segments.

19. The method as claimed in claim 1, wherein the tensile strength is determined by adjusting the temperature at which the stacked multilayer segments are pressed together and adjusting the pressing force applied during the pressing together of the stacked multilayer segments.

20. The method as claimed in claim 18, wherein the tensile strength is determined by adjusting the temperature at which the stacked multilayer segments are pressed together and adjusting the duration of the pressing together of the stacked multilayer segments.

21. The method as claimed in claim 1, wherein the tensile strength is determined by adjusting the pressing force applied during the pressing together of the stacked multilayer segments and adjusting the duration of the pressing together of the stacked multilayer segments.

22. The method as claimed in claim 1, wherein the tensile strength is determined by adjusting the temperature at which the stacked multilayer segments are pressed together, adjusting the pressing force applied during the pressing together of the stacked multilayer segments, and adjusting the duration of the pressing together of the stacked multilayer segments.

23. The method as claimed in claim 1, wherein the stacked multilayer segments are pressed together with a height of 0.8 mm to 1.2 mm.

24. The method as claimed in claim 1, wherein the stacked multilayer segments are pressed to produce the ceramic multilayer element with a height of 70 mm to 100 mm.

25. The method as claimed in claim 1, wherein the stacked multilayer segments are pressed together with a cross-sectional area of less than 110 $mm^2$.

26. The method as claimed in claim 1, wherein the stacked multilayer element is debinded.

27. The method as claimed in claim 1, wherein the stacked multilayer element forms at least a part of a piezoelectric multilayer element.

28. The method as claimed in claim 1, wherein the predetermined breakage region runs parallel to the ceramic layers and has reduced tensile strength, the predetermined breakage region being localized between adjacent multilayer segments and in pails of the ceramic layers of the adjacent multilayer segments.

29. The method as claimed in claim 28, wherein the predetermined breakage region is partially contained in an electrode layer that is arranged between adjacent ceramic layers.

30. The method as claimed in claim 28, wherein the predetermined breakage region is one of a plurality of breakage regions that are distributed over a height of the stacked multilayer element at regular distances.

31. The method as claimed in claim 28, wherein the predetermined breakage region runs between adjacent multilayer segments and is partially contained in them.

32. The method as claimed in claim 28, wherein the predetermined breakage region has a porosity that is higher than an average porosity of the ceramic layers in the stacked multilayer element.

33. A method for producing a ceramic multilayer element, the method comprising:
   forming a plurality of multilayer segments in a green state, wherein each multilayer segment has a plurality of ceramic layers in the green state and a plurality of electrode layers, wherein, while forming the plurality of multilayer segments, the multilayer segments are not located one on top of the other but are separate from each other, wherein each multilayer segment is formed separately by pressing together the plurality of ceramic layers and electrode layers at one pressing force;
   stacking the plurality of multilayer segments in the green state one on top of the other after forming the plurality of multilayer segments;
   pressing together the stacked multilayer segments in the green state thereby forming a multilayer element that is in the green state, wherein the one pressing force is greater than a pressing force applied during the pressing together of the stacked multilayer segments; and
   sintering the multilayer element that is in the green state thereby forming the ceramic multilayer element, the ceramic multilayer element comprising the ceramic layers and electrode layers arranged one on top of another,
   wherein at least one or more of a temperature at which the stacked multilayer segments are pressed together, the pressing force applied during the pressing together of the stacked multilayer segments, and a duration of the pressing together of the stacked multilayer segments, are adjusted such that the sintered ceramic multilayer element includes a boundary region between the stacked multilayer segments, the boundary region having a tensile strength that causes the boundary region to function as a predetermined breakage region, and
   wherein the tensile strength is determined by adjusting at least the duration of the pressing together of the stacked multilayer segments.

\* \* \* \* \*

UNITED STATES PATENT AND TRADEMARK OFFICE
CERTIFICATE OF CORRECTION

PATENT NO. : 9,728,706 B2
APPLICATION NO. : 13/194830
DATED : August 8, 2017
INVENTOR(S) : Georg Kuegerl Page 1 of 1

It is certified that error appears in the above-identified patent and that said Letters Patent is hereby corrected as shown below:

On the Title Page

Item (75) Inventors, Line 3, delete "Gr. St. Florain" and insert --Gr. St. Florian--.

In the Claims

In Column 10, Line 60, Claim 28, delete "pails" and insert --parts--.

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*